United States Patent [19]

Kobayashi

[11] Patent Number: 5,051,955
[45] Date of Patent: Sep. 24, 1991

[54] SEMICONDUCTOR MEMORY HAVING IMPROVED DATA READOUT SCHEME

[75] Inventor: Yasuo Kobayashi, Tokyo, Japan

[73] Assignee: NEC Corporation, Tokyo, Japan

[21] Appl. No.: 543,526

[22] Filed: Jun. 26, 1990

[30] Foreign Application Priority Data

Jun. 26, 1989 [JP] Japan .................................. 1-163521

[51] Int. Cl.$^5$ ............................................ G11C 7/06
[52] U.S. Cl. ........................... 365/189.02; 365/189.05; 365/190; 365/205; 365/233.5
[58] Field of Search ...................... 365/189.05, 189.02, 365/205, 190, 233.5

[56] References Cited

U.S. PATENT DOCUMENTS 4,825,110  4/1989  Yamaguchi et al. ................. 365/205

Primary Examiner—Joseph E. Clawson, Jr.
Attorney, Agent, or Firm—Sughrue, Mion, Zinn, Macpeak & Seas

[57] ABSTRACT

A semiconductor memory device capable of reading out stored data at high speed and with low power consumption includes a sense amplifier for amplifying a data signal stored in a selected memory cell, a data latch circuit for latching the output signal of the sense amplifier, a switching circuit for outputting the output signal of the data latch circuit, and an output circuit for receiving the output signal of the sense amplifier and the output signal of the switching circuit and generating a data output signal. It also includes at the power supply side, switching means for keeping the sense amplifier in an operative state as long as data signal is amplified in response to a sense enable signal.

5 Claims, 9 Drawing Sheets

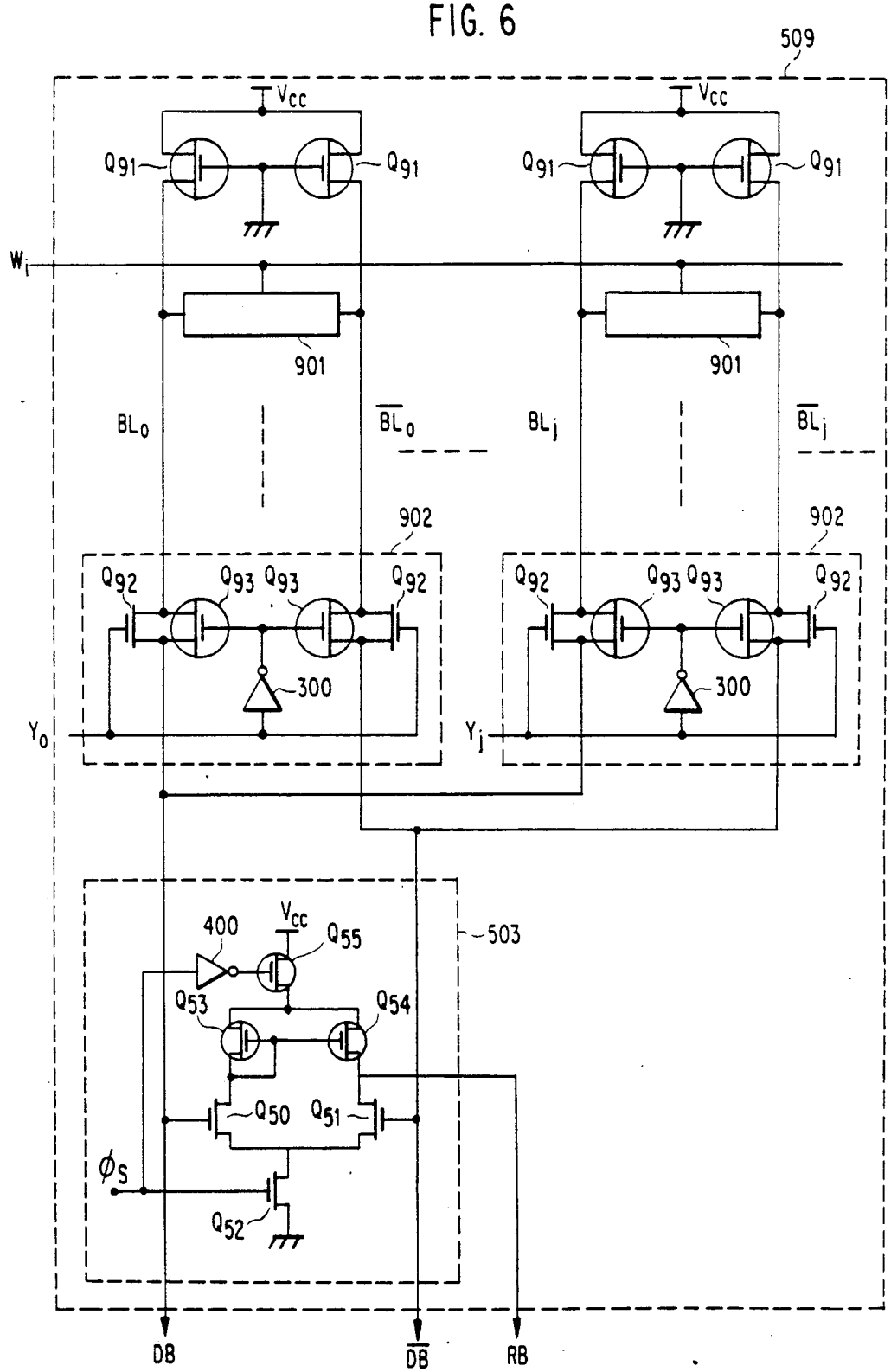

5,051,955

SEMICONDUCTOR MEMORY HAVING IMPROVED DATA READOUT SCHEME

BACKGROUND OF THE INVENTION

1. Field of the Invention

This invention relates to a semiconductor memory, and more particularly to a readout circuit of a static memory.

2. Description of the Prior Art

A known data readout circuit for a static memory disclosed in U.S. Pat. No. 4,766,572 is constructed on the basis of knowledge that a signal readout from a memory cell and amplified by a sense amplifier is transferred through a data latch circuit to an output circuit, and the delay associated with the activation of the data latch circuit is the principal cause for the delay of data output, in such way that both the signal amplified by the sense amplifier and the output signal of the data latch circuit are applied to a switching circuit, and then the output of the switching circuit is supplied to the output circuit. During the period the sense amplifier is maintained operative, the switching circuit allows transfer and output of the amplified signal. Once the sense amplifier is deactivated, it transfers the output of the data latch circuit to output it to the output circuit. Thus the output signal is held at the data output terminal of the memory. In other words, the amplified signal from the sense amplifier is supplied to the output circuit before the data latch circuit is operated, and earlier according to such, output signal appears at the output terminal, with effect of reducing period of time between application of an address onto the memory and appearance of data output, that is access time. While the output of the data latch circuit is transferring, the switching circuit disconnects the output terminal thereof from the output terminal of the sense amplifier because of preventing the change in the potential at the output terminal of the sense amplifier resulting from the deactivation of the sense amplifier from affecting adversely the output of the switching circuit, that is, the output of the data latch circuit supplied to the output circuit.

Increases in memory capacity and improvement in operating speed are required endlessly. The readout speed of the above-mentioned prior art has been unsatisfactory in these days, too.

SUMMARY OF THE INVENTION

Objects of the Invention

It is an object is to provide a semiconductor memory capable of reading out data at higher speeds.

Another object of the invention is to provide a semiconductor memory having an improved construction of readout circuit.

The present invention is based on the knowledge of the readout circuit disclosed in U.S. Pat. No. 4,766,572, that when the amplified signal is transferred from the sense amplifier through the switching circuit to the output circuit, considerable delay results because of the switching circuit. The switching circuit causes prolongation of the data (output) readout time by the sum of the time it takes for the switching gate permitting the transfer of the amplified signal to turn ON and the time it takes for the amplified signal to pass through the transfer gate.

According to the invention, means for disconnecting the terminal of the sense amplifier from power supply when it is deactivated is provided to be connected to the sense amplifier so as to prevent the deactivation of it from inducing variation in the potential of the output terminal of it. The disconnection means makes it unnecessary to provide a switching gate between the output terminal of sense amplifier and the input terminal of the output circuit. According to the present invention, therefore, the output terminal of the sense amplifier is connected directly to the input terminal of the output circuit without the intermediation of switching gate. The output terminal of the sense amplifier is connected, for one thing, to the input terminal of the data latch circuit, and the output of the data latch circuit is connected to the input terminal of the output circuit through the switching gate of the switching circuit. When the switching gate of the switching circuit is in the ON state, therefore, a high impedance state is made between the output terminal of the sense amplifier and two terminals of the power supply.

The semiconductor memory according to the invention comprises a sense amplifier for amplifying a data signal readout from selected memory cells, a latch circuit for latching the output signal of the sense amplifier, a switching circuit connected to the output terminal of the latch circuit, and an output circuit having an input terminal connected to the output terminal of the switching circuit and the output terminal of the sense amplifier and adapted for receiving at least one of the output signal from the sense amplifier and the output signal of the switching circuit and outputting a data output signal, the sense amplifier including means for making a high impedance between the output of the sense amplifier and two terminals of power supply.

In another preferred embodiment of the present invention, the sense amplifier amplifies a data signal in response to a first control signal and transfers the amplified data signal to the output terminal thereof, and the latch circuit latches the amplified output signal in response to a second control signal generated while the first control signal is generating, and the switching circuit, turns ON and supplies the output signal of the latch circuit to the output circuit, in response to a third control signal during a desired period except the period of generating the first control signal, wherein high impedance is held between the output terminal of the sense amplifier and two terminals of power supply during a desired period of time except the period for generating the first control signal.

According to the invention, the output signal of the sense amplifier can be applied to the output circuit without any delay, and this not only contributes to reducing the time it takes for readout data to appear at the output terminal of the output circuit or the data output terminal but also thereby enables faster data readout.

BRIEF DESCRIPTION OF THE DRAWINGS

The above-mentioned and other objects, features and advantages of this invention will become more apparent by reference to the following detailed description of the invention taken in conjunction with the accompanying drawings, when FIG. 1 a block diagram of a semiconductor memory in the prior art.

FIG. 6 is a schematic circuit diagram of the memory cell matrix in FIG. 5;

DETAILED DESCRIPTION OF THE INVENTION

Figure 1:
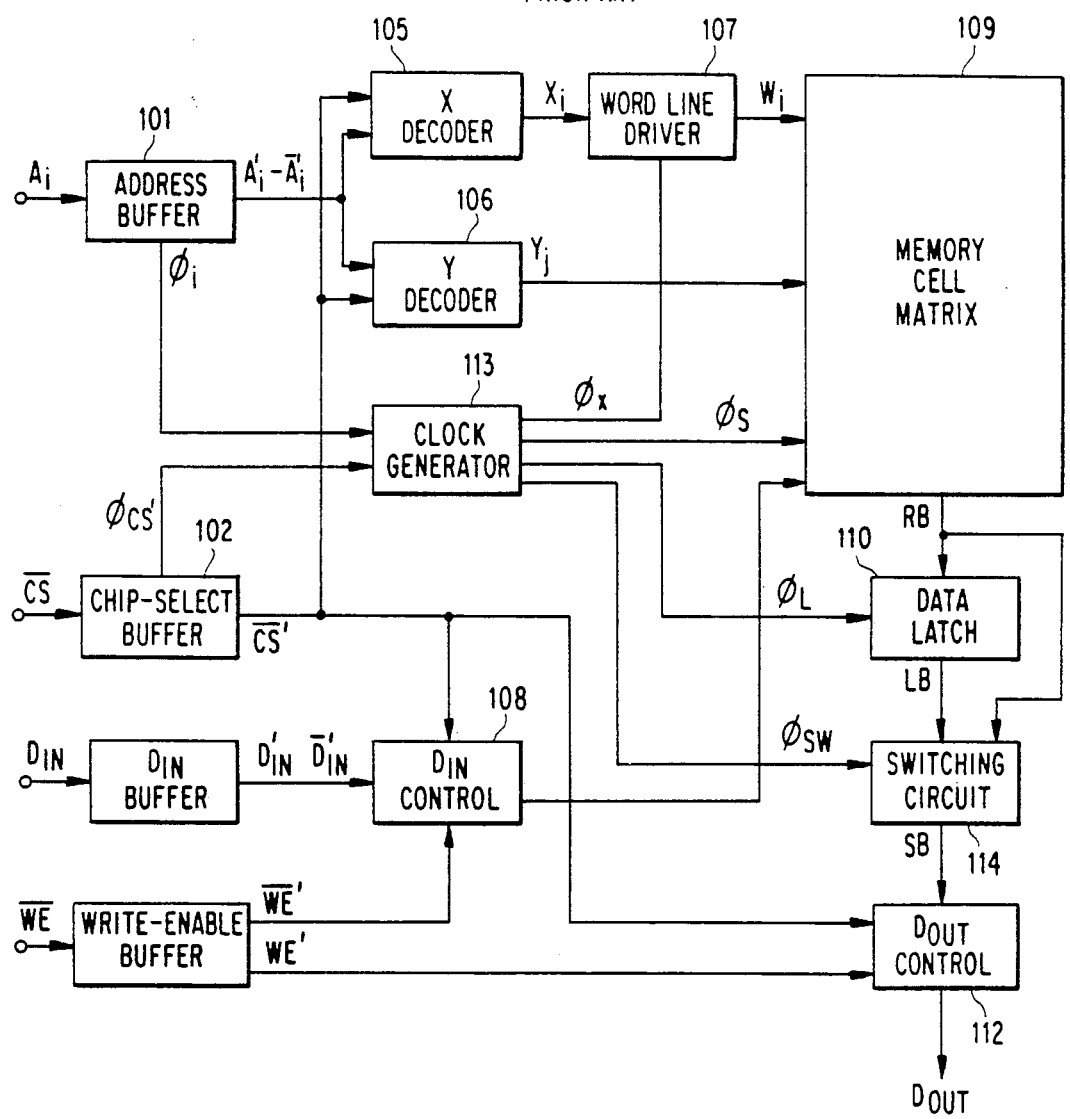
Figure 3:
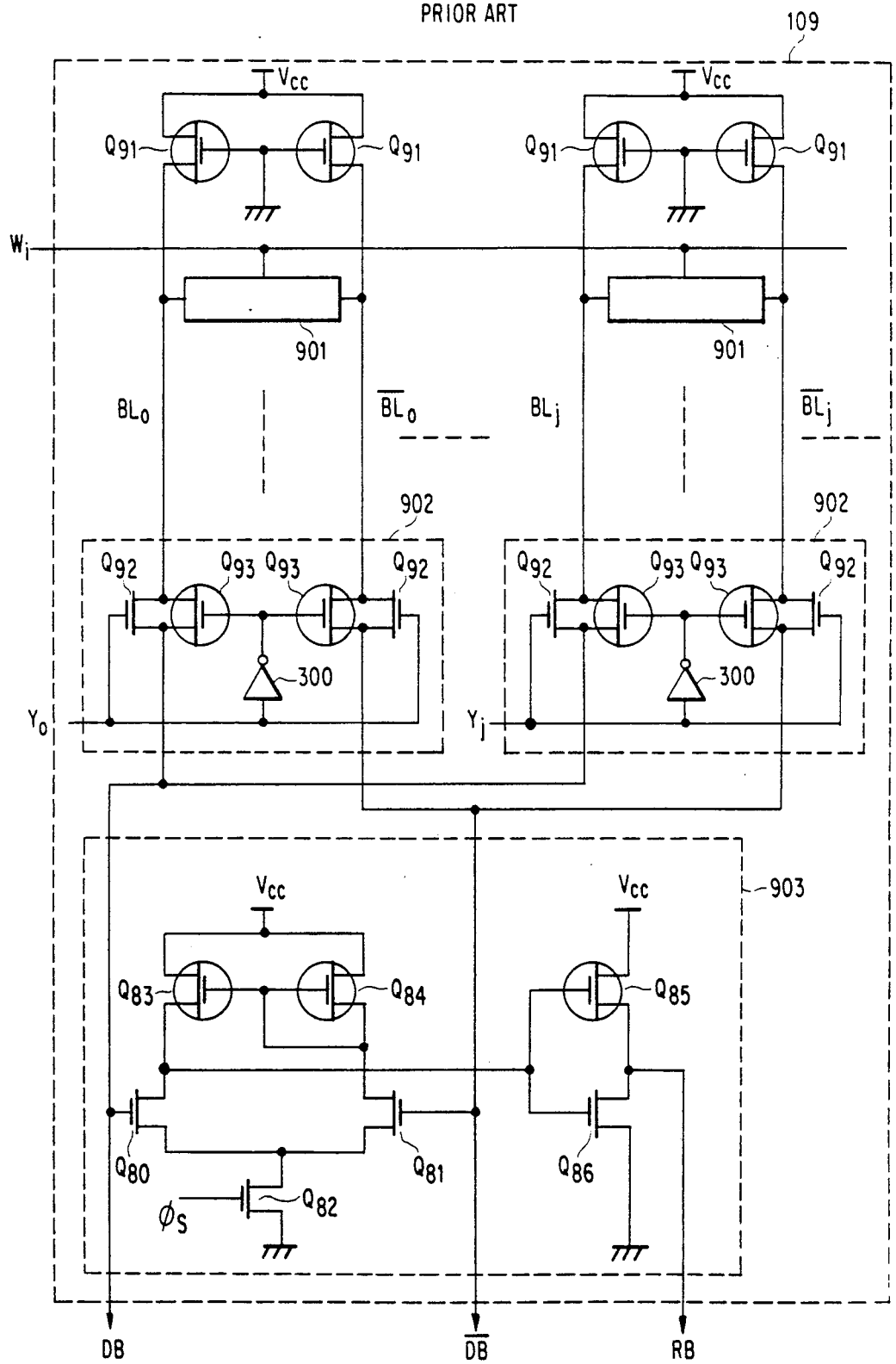
FIG. 3 is a schematic diagram of the memory cell matrix in FIG. 1.
Figure 4:
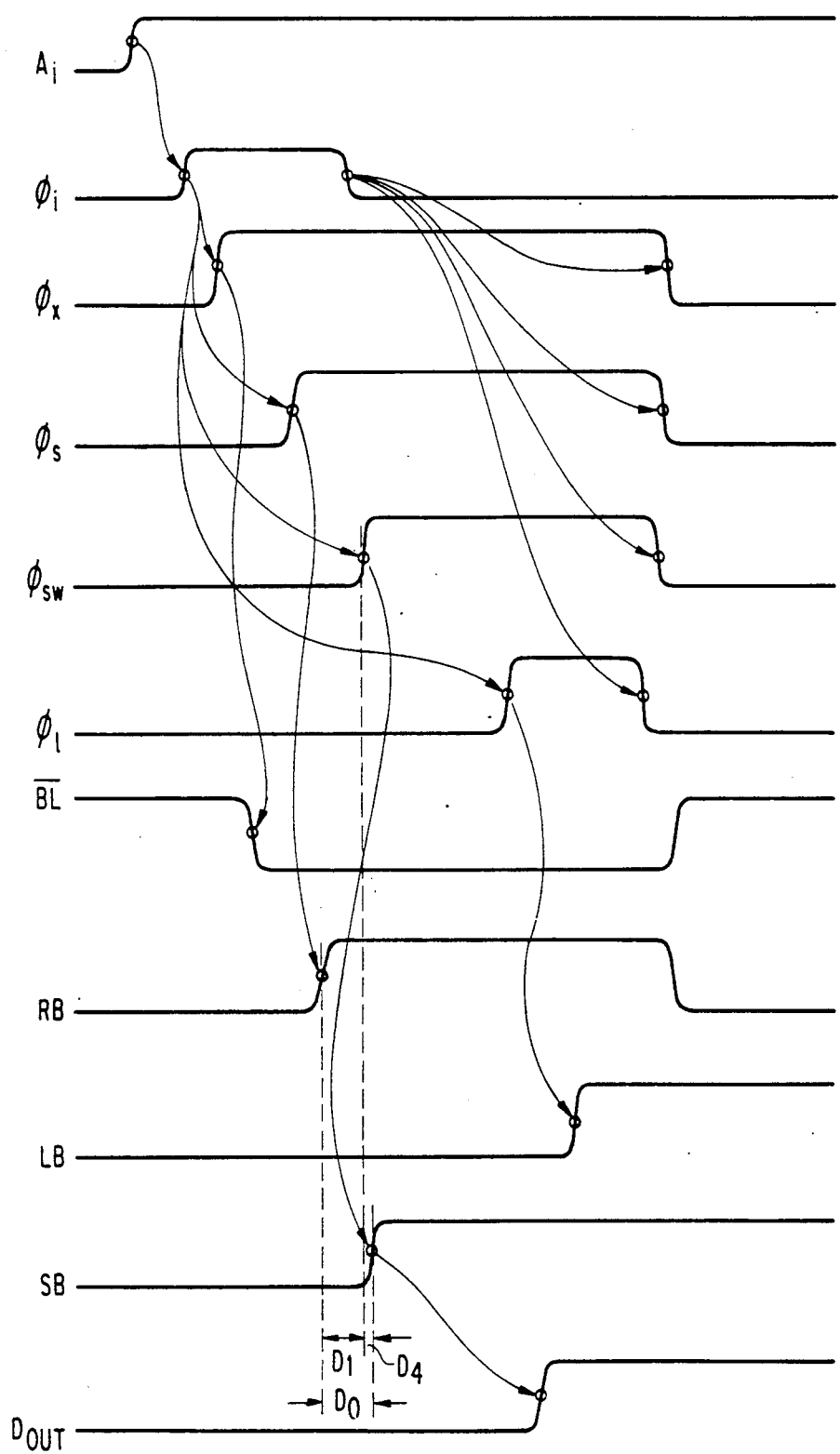
FIG. 4 is a timing diagram illustrative of readout operation from art semiconductor memory.

Out of the operation of the prior art memory readout circuit disclosed in U.S. Pat. No. 4,766,572, the part involving the present invention will be described below referring to FIGS. 1 through 4. The other part is detailed in the same U.S. Patent. Referring to FIGS. 1 and 4, an address buffer 101 detects change of address signal $A_1$ and outputs address change detection signal $\phi_i$ for a certain period as of 10 ns to a clock generator 113 and at the same time outputs complementary address buffer signals $A_1$ and $A_1'$ to a X decoder 105 and Y decoder 106. A chip select buffer 102, upon receiving chip select signal $\overline{CS}$, outputs chip select change signal $\phi_{CS}$ for a certain period to the clock generator 113 and simultaneously outputs chip select buffer signal CS' to a data input control circuit 08 and a data output control circuit 112. When no write enable signal WE is input, signal WE' from a write enable buffer and the signal CS' activate the data control circuit 112 which outputs the input signal receiving at the input end of it from the output terminal $D_{OUT}$ of it. When write enable signal $\overline{WE}$ is input, write enable buffer 104 output WE' without outputting WE'. Thus the data output control circuit 112 does not operated. Instead the data input control circuit 108 is operated and applied to data input terminal $D_{IN}$. Then complementary data input buffer signals $D'_{IN}$ and $\overline{D'_{IN}}$ produced in a data input buffer 103 are supplied from there to the memory cell matrix 109. Clock generator 113 receives two change detection signal $\phi_i$ and $\phi_{CS}$ and generates in turn four control signals $\phi_X$, $\phi_X$, $\phi_{SW}$ and $\phi_L$ as shown in FIG. 4. The clock generator initially generates a word line activating signal $\phi_X$ which is supplied to a word line drive circuit 107. After the lapse of a certain period, it generates sense enable signal $\phi_S$, which activates a sense amplifier in the memory cell matrix 109. After the lapse of another certain period, it also causes a switching signal $\phi_{SW}$ to rise and supplies the resulting signal to the switching circuit 114. After the lapse of a further certain period, it finally outputs a data latch signal $\phi_L$ to the data latch circuit 110 which is operated. The four control signals $\phi_L$, $\phi_S$, $\phi_{SW}$, and $\phi_X$ drop in turn.

Figure 2:
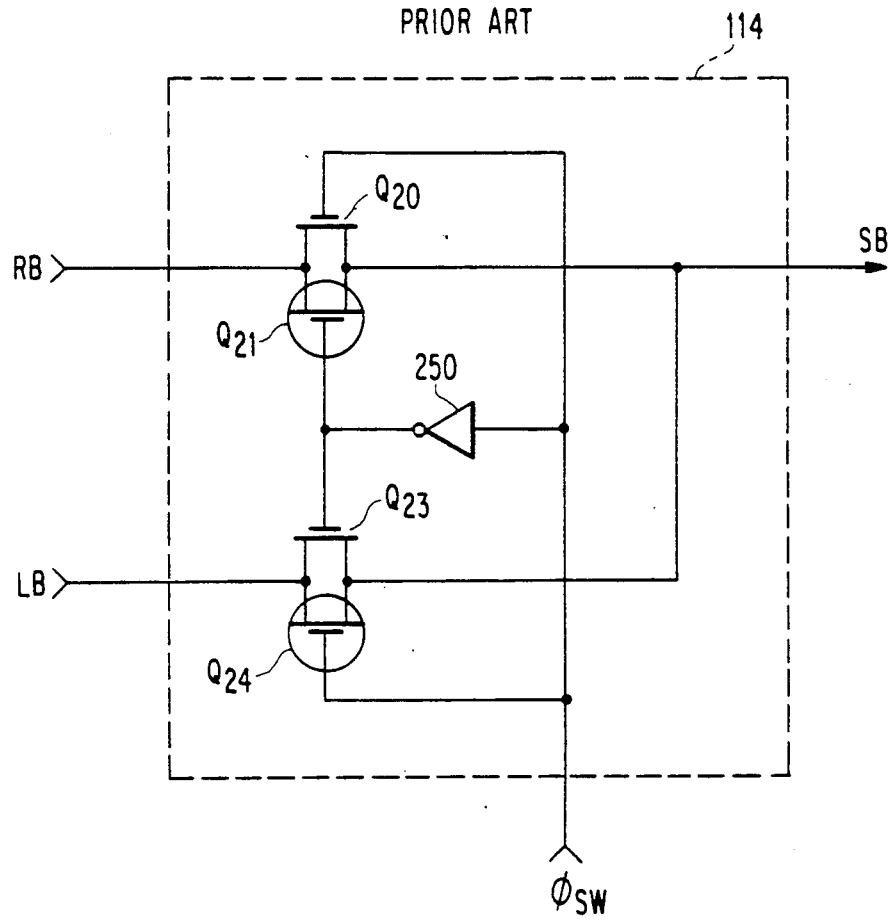
FIG. 2 is a schematic diagram of the switching circuit in FIG. 1.

Word line drive circuit 107 supplies X address signal $X_i$ from X address decoder 105 to word line $W_i$ as long as word line activating signal $\phi_X$ stays at a high level. Referring to FIG. 3, in memory cell matrix 109, each bit line pair $B_{LI}$, $B_{LO}$, ..., $B_{Li}$, ... get precharged to a high level through a p-channel precharge transistor $Q_{91}$ from power supply Vcc. Y address signal $Y_i$ from Y address decoder 106 causes one of CMOS transfer gates 902, 902 to turn ON and one of the bit line pair (in this prior art, $BL_i$ and $BL_i$) is connected to a pair of data lines DB and DB' and of the sense amplifier 903. As the result, both input transistors $Q_{80}$ and $Q_{81}$ sense amplifier 903 turn ON. Since the activating signal $\phi_S$ is at a low level however, n-channel transistor $Q_{82}$ is in OFF state, and so no current flows. Electric charge is supplied from power supply Vcc through p-channel transistors $Q_{83}$ and $Q_{84}$ connected to form a current mirror output circuit, and thus the output terminal of input transistor $Q_{80}$ is at high level. This is received by n-channel transistor $Q_{86}$ of an inverter, which is in the ON state. Accordingly the output terminal of the inverter, that is the output terminal RB of sense amplifier 903 is at a low level. The rise of word line activating signal $\phi_X$ causes X address signal $X_i$ to be supplied to word line $W_i$, and in turn, memory cell 901 is selected. In response to this memory cell contents, a pair of bit lines $BL_i$ and $BL_i$ change in potential. Now assuming that $BL_i$ change to a low level and $BL_i$ is kept at high level, then as shown in FIG. 4, change of $\phi_X$ causes change of bit line $\overline{BL}$. While the data line DB of sense amplifier 903 stays at the high level, $\overline{DB}$ goes to a low level, input transistor $Q_{80}$ turns ON, and input transistor $Q_{81}$ turns OFF. Then sense amplifier activating signal $\phi_S$ rises, causing activating transistor $Q_{82}$ to turn ON, resulting, in turn, in a change of the output terminal of input transistor $Q_{80}$ to low level, in a turn-off of n-channel transistor $Q_{86}$ and a turn-on of p-channel transistor $Q_{85}$ of the inverter, and in an application of the high level of the power supply Vcc to output terminal RB. In this way the output data of the selected cell within memory cell matrix 109 is amplified by sense amplifier 903 and output as an amplified signal RB. Output signal RB of the sense amplifier is supplied to both data latch circuit 110 and switching circuit 114. In response to data latch signal $\phi_L$, data latch circuit 110 is activated and the output LB of it rises. Referring to FIG. 2 as well, both the output RB of the sense amplifier and the output LB of the data latch circuit are input into the switching circuit 114. In switching circuit 114, each input is connected to a common output SB through the first CMOS transfer gate consisting of n-channel transistor $Q_{20}$ and p-channel transistor $Q_{21}$ and the second CMOS transfer gate consisting of n-channel transistor $Q_{23}$ and p-channel transistor $Q_{24}$, respectively. While switching control signal $\phi_{SW}$ is held at a low level (before it rises), the second CMOS transfer gate is in ON state, and thus signal LB from the data latch circuit is supplied as switching output SB to data output circuit 112. Rise (change to high level) of switching control signal $\phi_{SW}$ causes the second CMOS transfer gate to turn OFF, and instead the first CMOS transfer gate to turn ON, and thus signal RB from the sense amplifier is supplied as switching output SB to data output circuit 112. As shown in FIG. 4, in response to sense amplifier output RB, switching output SB rises and in turn, also output data $D_{OUT}$ rises and is output as a high level data.

After data latch signal $\phi_L$ is dropped, data latch circuit 110 still holds its output LB at high level. Then trailing switching control signal $\phi_{SW}$ causes the first and second CMOS transfer gates of switching circuit 114 to turn OFF and ON, respectively, and thus the switching output SB (which corresponds to inputs into data output circuit 110) is switched from sense amplifier output RB into latch circuit output LB. The data contents (high level) of it however remains unchanged. Then sense amplifier activating signal $\phi_S$ drops, and causes transistor $Q_{82}$ in sense amplifier 903 (FIG. 3) to turn OFF, resulting in return of the output of transistor $Q_{80}$ back to high level, which causes sense amplifier output RB to go to a low level. By this change of RB, however, owing to that the first CMOS transfer gate of switching circuit 114 is in OFF state, switching circuit output SB is unaffected, and therefore both latch output LB and data output circuit 112 remain unchanged.

Referring to FIG. 4, readout of data output $D_{OUT}$ begins under the timing determined by the time when input of data output circuit (switching output SB in this prior art) begins to change. Readout output from the memory cell matrix, that is, sense amplifier output RB, begins to change a period $D_O$ earlier than does so switching output SB. In other words, this prior art has an disadvantage that input into the data output circuit delays by period $D_O$ with respect to the data readout from the sense amplifier. This delay $D_O$ is expressed as $D_1+D_4$, where $D_1$ is the delay until the rise of switching signal $\phi_{SW}$ and $D_4$ is the time it takes for the first CMOS transistor gate of switching circuit 114 to turns ON and then for sense amplifier output RB to transfer therethrough. Assuming that the equivalent resistance when both transistors $Q_{20}$ and $Q_{21}$ in FIG. 2 which constitute the first CMOS transfer gate are in ON state is 1 Kp106, and the capacity of the switching output bus line SB is 3 pF, then delay time induced by the pass of the signal through the first CMOS transfer gate amounts to about 3 nS. It is noted that upon comparison with the access time of the semiconductor memory, assuming such as 30 nS, delay $D_O$ is considerable.

DESCRIPTION OF THE PREFERRED EMBODIMENTS

Figure 5:
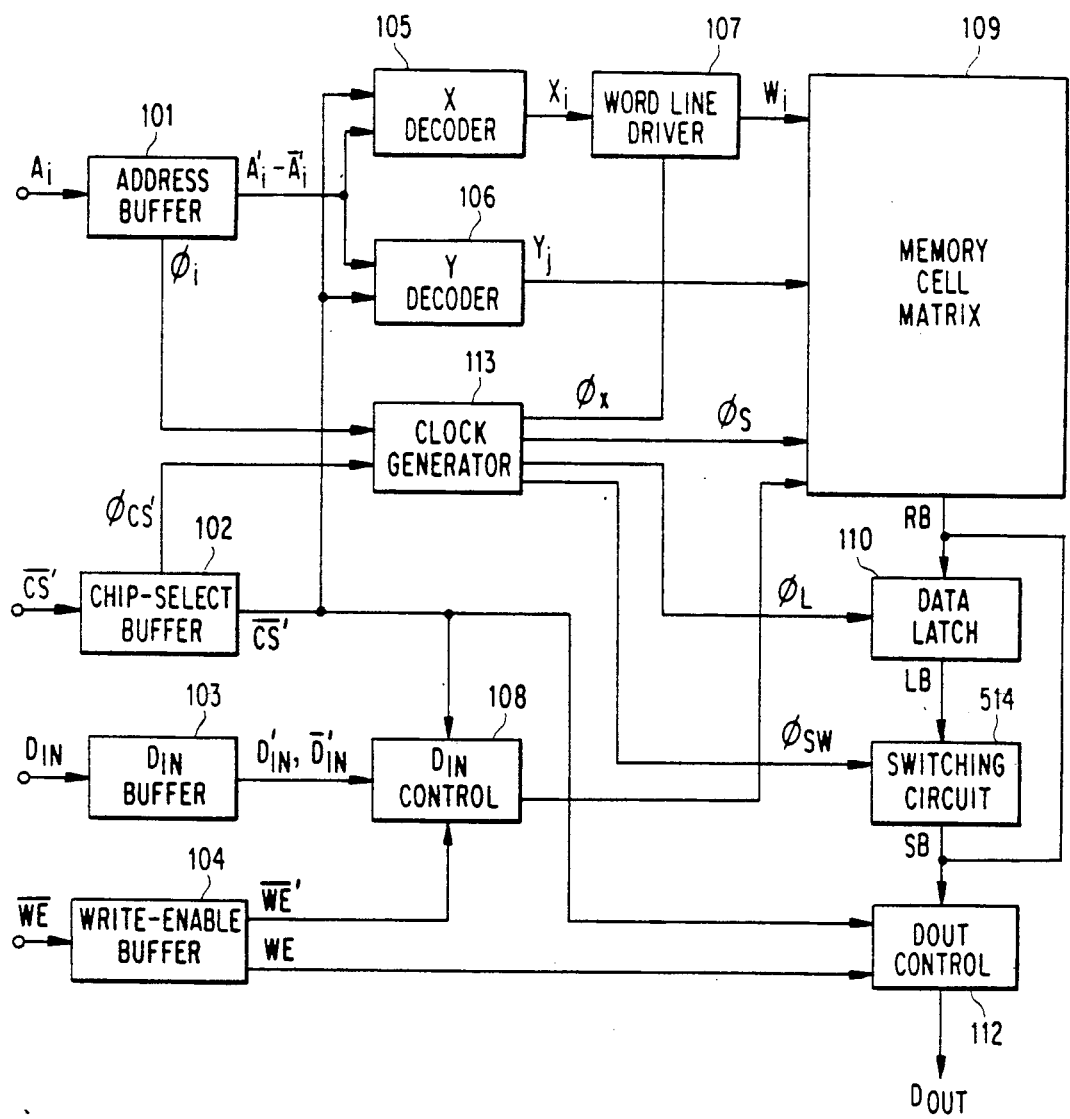
FIG. 5 is a block diagram of a first embodiment of semiconductor memory embodying the present invention.

With reference to FIGS. 5 through 8, a first embodiment of the invention will be described below:

Referring to FIGS. 5 and 6, the first embodiment is different from the prior art illustrated in FIGS. 1 through 3 in the following respects: the construction of a sense amplifier 503 within a memory cell matrix 509, the construction of a switching circuit 514, and the direct connection of sense amplifier output RB to a data output circuit 112. Correspondent parts or components are designated by the same reference characters and description of them is omitted.

Figure 7:
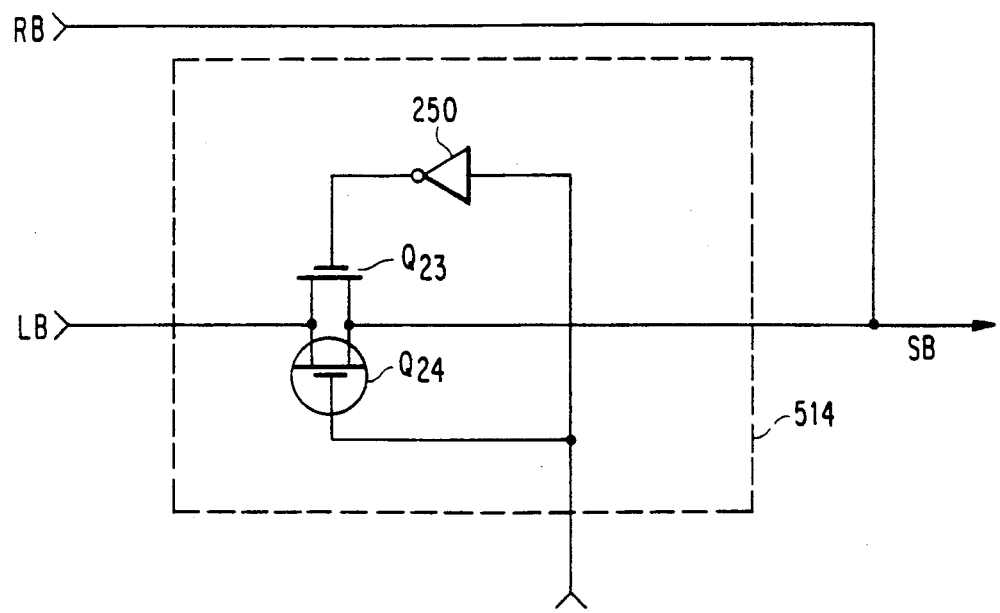
FIG. 7 is a schematic diagram of the switching circuit in FIG. 5.

The sense amplifier 503 of the first embodiment diagrammed schematically in FIG. 6 comprises input n-channel transistors $Q_{50}$ and $Q_{51}$ of which gates are connected to a pair of data lines DB and $\overline{DB}$, respectively; input p-channel transistors $Q_{53}$ and $Q_{54}$ connected to the outputs of transistors $Q_{50}$ and $Q_{51}$, respectively, and constituting a current mirror circuit; and an activating n-channel transistor $Q_{52}$ of which the gate receives sense amplifier activating signal $\phi_S$ and the other electrodes each are connected to the common terminal of input transistors $Q_{50}$ and $Q_{51}$ and ground, respectively; and a breaking p-channel transistor $Q_{55}$ of which the gate receives sense amplifier activating signal $\phi_S$ through an inverter 400 and the other electrodes each are connected to the common source of p-channel transistors $Q_{53}$ and $Q_{54}$ and power supply Vcc, respectively. Sense amplifier output RB outputs from the output terminal of input transistor $Q_{51}$. When enable signal $\phi_S$ is held at high level, transistors $Q_{52}$ and $Q_{55}$ are in ON state, and hence the sense amplifier is held in an activated state, during which readout data from the memory cells on data bus lines DB and $\overline{DB}$ is amplified and the amplified data is output at sense amplifier output RB. When sense enable signal $\phi_S$ is held at low level, both n-channel transistor $Q_{52}$ and p-channel transistor $Q_{55}$ are in OFF state so that high impedance is provided between sense amplifier output RB, and power supply Vcc and ground GND, respectively. The potential of sense amplifier output RB therefore remains unchanged even if $\phi_S$ changes to low level, and in turn, data output circuit 112 is unaffected. In accordance with the present invention, for this reason, sense amplifier output RB can be connected directly to data output circuit 112 without needing to be connected through the transfer gate. Switching circuit 514 therefore, as shown in FIG. 7, comprises only transistors $Q_{23}$, $Q_{24}$ constituting the second CMOS transfer gate, and inverter 250, that is, those remaining as the result of the removal of $Q_{23}$, $Q_{24}$ constituting the second CMOS transfer gate from the prior art switching circuit shown in FIG. 2.

Figure 8:
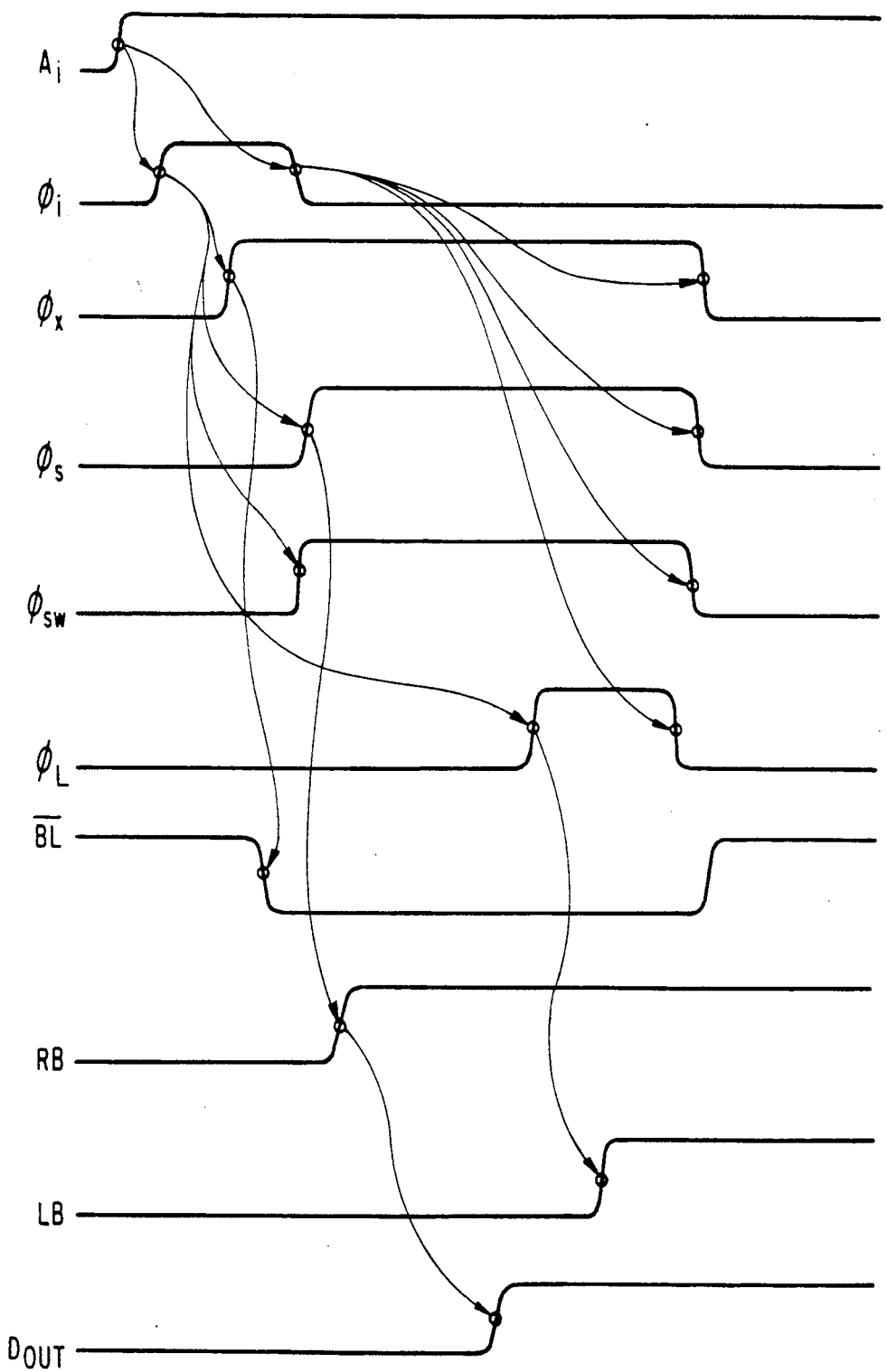
FIG. 8 is a timing diagram illustrative of readout operation from memory in FIG. 5.

In the following, the readout operation of this Example will be described with reference to the timing diagram shown in FIG. 8 as well.

When the semiconductor memory is executing selection at low level of chip select input signal $\overline{CS}$, address decoder output signal $X_i$ and address decoder output $Y_j$ change with changing address signal $A_1$. Once address signal $A_1$ changes, address change detection signal $\phi_i$ is generated, resulting, in sequential rise (from low level to high level) of word line clock signal $\phi_X$, switching control signal $\phi_{SW}$, sense enable signal $S$ and data latch signal $\phi_L$. Rise of word line activating signal $\phi_X$ causes word line $W_i$ supplied with address decoder output signal $Z_i$, and nothing else, to rise from low level to high level, thereby data held in memory cell 901 begins to appear on bit lines BL, $\overline{BL}$. On the other hand, only address decoder output signal $Y_j$ is selected, and in turn only the transfer gate 902 is opened. As the result, only the data of memory cell 901 is transferred to data bus lines DB, $\overline{DB}$ of sense amplifier 503. Rise of sense enable signal $\phi_S$ causes sense amplifier 503 to activate, and in turn, data corresponding to memory cell data appears on readout data RB of sense output.

Slightly before memory data appears at readout data RB, switching control signal $\phi_{SW}$ rises, thus causing transfer gate transistors $Q_{23}$, $Q_{24}$ between output LB of data latch 110 and latch output SB, that is, input of data output circuit 112, to turn OFF. Accordingly readout data appears, through sense amplifier 503, on readout data RB from sense amplifier and is supplied directly to data output control circuit 112 without being disturbed by latch data LB. Then data $D_{OUT}$ of the same phase of that of readout data RB is output on the data output terminal. On the other hand, data latch signal $\phi_L$ rises after the lapse of a sufficient time following the appearance of readout data on readout data RB. The reason For of delaying the timing of data latch signal $\phi_L$ resides in avoiding errors due to noise pulses which may happen to appear on address signal $A_1$. Rise of data latch signal $\phi_L$ causes, in data latch 110, transfer gate 226 to open, and readout sense amplifier output data RB is latched into flip-flop circuit 227, and data of the same phase as readout data RB is output to latch data LB. Then after the above-mentioned readout steps of data output $D_{OUT}$ are complete, sequential drop of data latch signal $\phi_L$, sense enable signal $\phi_S$, switching control signal $\phi_{SW}$, and word line activating signal $\phi_X$ are caused, thus finishing serial readout operation. The drop of sense enable signal $\phi_S$ turns transistors $Q_{52}$ and $Q_{55}$ OFF so that sense amplifier 503 again becomes a high impedance state. Subsequently dropping switching control signal $\phi_{SW}$ causes transfer gate transistors $Q_{23}$, $Q_{24}$ of switching circuit 514 to turn ON so that data latch output LB is connected to input of data output circuit 112. Transfer gate transistors $Q_{23}$, $Q_{24}$ are in ON state, and hence latch output LB is connected to sense amplifier output RB, too. In sense amplifier 503, however, output terminal RB is in a disconnected state to ground GND and power supply Vcc, and hence unchanged in potential, and in turn, latch data LB is unaffected. As the result, sense amplifier output RB can be applied directly to the data output circuit, thus on access time of delay $D_O$ due to nullifying the transfer gate of the switching circuit in the prior art.

As described above, according to the prevent invention, high speed semiconductor memory device providing a short access time can be realized by the construction that while sense amplifier is staying in nonoperative state, simultaneously sense amplifier is held in high impedance state, as described above, so as to eliminate the transfer gate on the line which is a time delaying element or a factor involved in access time.

Figure 9:
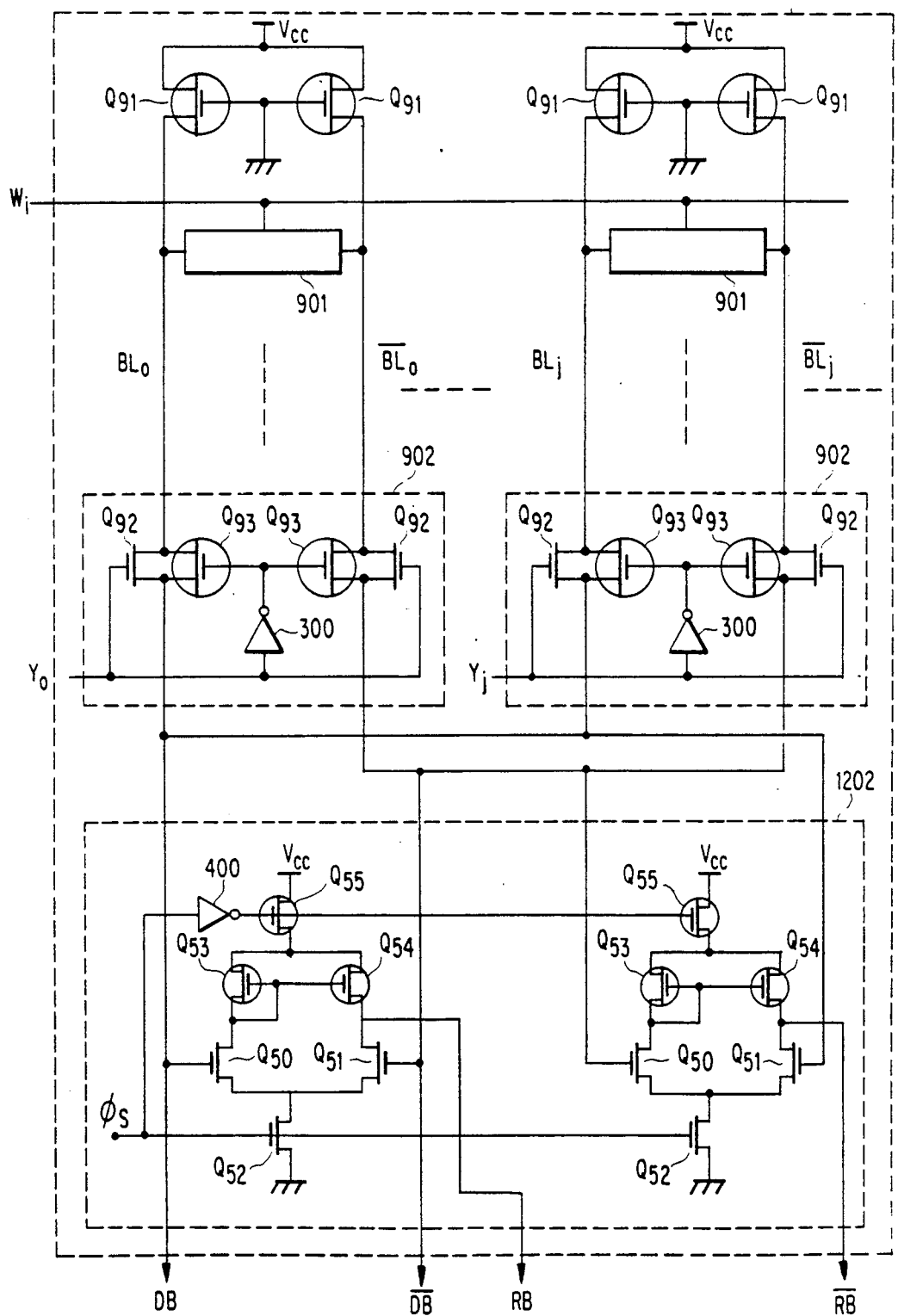
FIG. 9 is a circuit diagram schematically illustrating the memory cell matrix which is a component of a second embodiment of the present invention.
Figure 10:
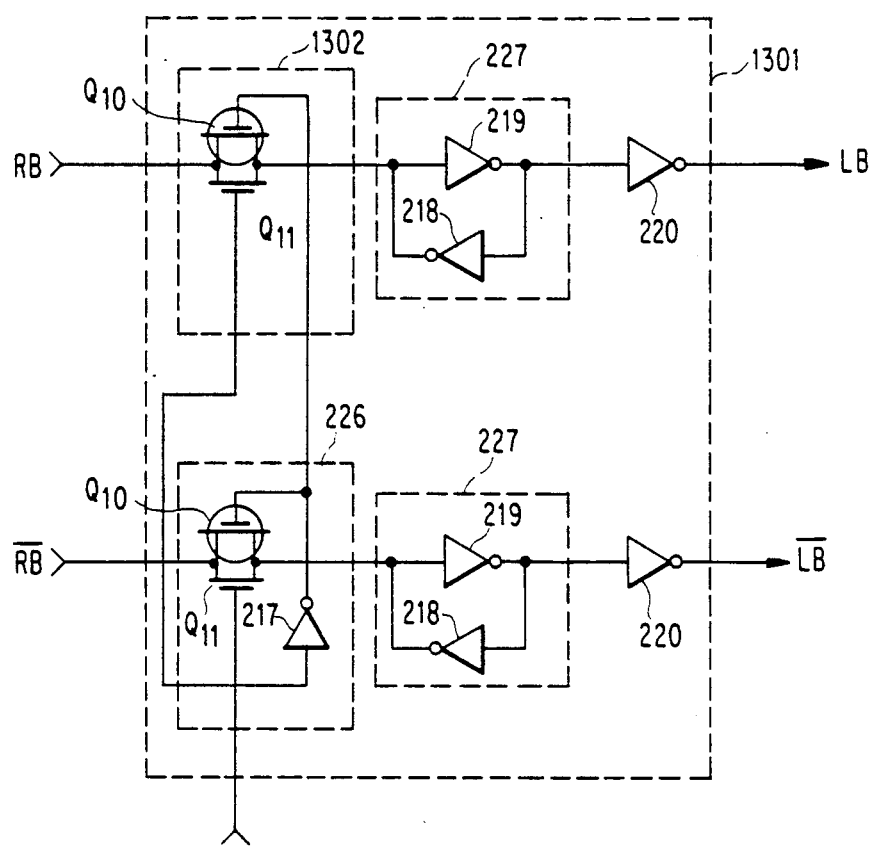
FIG. 10 is a schematic diagram of the data latch circuit which is a component of the second embodiment.
Figure 11:
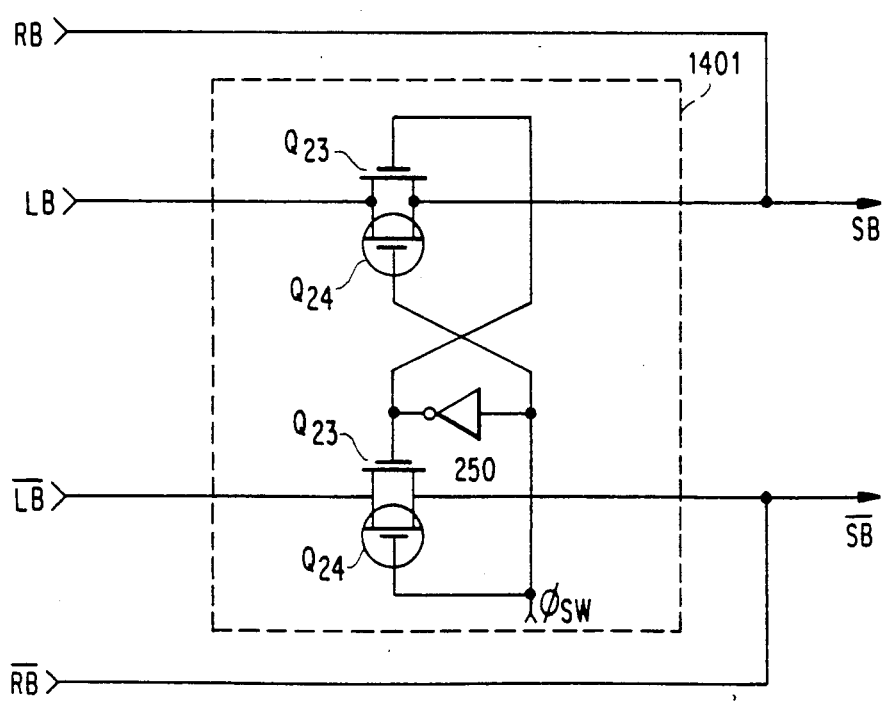
FIG. 11 is a schematic diagram of the switching circuit which is a component of the second embodiment.

Description will be given on a second embodiment of the invention with reference to FIGS. 9 through 11.

For the purpose of allowing dual readout, the second embodiment comprises sense amplifier 1202 (FIG. 9) of memory cell matrix 1201, data latch 1301 (FIG. 10) and switching circuit 1401 (FIG. 11) each in place of sense amplifier 503 of memory cell matrix 509, data latch 110 and switching circuit 514, respectively, in Example 1. Sense amplifier 1202, as diagrammed schematically in FIG. 9, is a parallel arrangement of two sense amplifiers 503 stated in the first embodiment such that two types of data lines DB, $\overline{DB}$ are connected in inverted relation to allow readout data from the sense amplifier to form complementary signals, that is, positive phase RB and inverse phase $\overline{RB}$. This construction permits realization of fast access time compared with Example 1. Likewise each of data latch 1301 and switching circuit 1401, as diagrammed schematically in FIG. 10 and 11, respectively, are parallel arrangements of two data latch 110 and switching circuit 514 stated in the first embodiment, respectively. Sense amplifier readout data RB, $\overline{RB}$ is applied in parallel to latch circuit 1301 and connected to switching outputs SB, $\overline{SB}$. Latch outputs LB, $\overline{LB}$ are input in parallel into switching circuit 1401. Like the first embodiment, the second embodiment permits realization of a semiconductor memory device having high speed access time by this construction for creating the state such that transfer gates on the lines which are involved in access time are removed.

As described above, the semiconductor memory device according to the invention permits realization of shorter access time by virtue of the construction that while data of the data latch is being output, the sense amplifier is held in such high impedance state that transfer gates on the lines, which are a time delaying element or factor involved in access time, were substantially eliminated.

What is claimed is:

1. A semiconductor memory comprising:
a plurality of memory cells;
means for receiving address information;
a sense amplifier having an input end, an output end, a first voltage terminal receiving a first voltage and a second voltage terminal receiving a second voltage;
a selection circuit responsive to said address information for selecting one of said memory cells to thereby apply a data signal from the selected memory cell to said input end of said sense amplifier, said sense amplifier generating a sense output signal of a level approximating that of one of said first and second voltages at the output end thereof in response to said data signal in a first state and isolating said output end thereof from both of said first and second voltage terminals thereby to set said output end thereof at a high impedance state in a second state;
a latch circuit having an input end coupled to the output end of said sense amplifier and holding said sense output signal generated by said sense amplifier at an output end thereof;
an output circuit having an input end and an output signal at the output end thereof;
a switch circuit providing a signal path between the output end of said latch circuit and the input end of said output circuit in an enables state and isolating herebetween in a disabled state;
a circuit connection directly coupling the output end of said sense amplifier to the input end of said output circuit independent of said switch; and
a control circuit for controlling said sense amplifier and said switch circuit in such a manner that after one of said memory cells is selected, said sense amplifier is set as said first state under the disabled state of said switch circuit thereby to directly transfer the sense output signal to the input end of said output circuit, and after the transfer of said sense output signal to the output circuit the switch circuit is shifted to the enabled state thereby to apply the sense output signal held by said latch circuit to the input end of said output circuit, and said sense amplifier circuit is shifted from said first state to said second state.

2. The semiconductor memory according to claim 1, in which said sense amplifier includes a first switch coupled between said first voltage terminal and a first node, a second switch coupled between a second node and said second voltage terminal, and first and second series circuits, each of said first and second series circuits including a load element and an input transistor connected in series between said first node and said second node, said first and second switches being rendered non-conductive in said second state and conductive in said first state.

3. The semiconductor memory according to claim 1, in which said memory cells are static-type memory cells.

4. The semiconductor memory according to claim 1, in which said memory cells are arranged in a matrix form of rows and columns with work lines in rows and bit line pairs in columns, and said selection circuit includes a row decoder for selecting one of said work lines and a column decoder for selecting one of said bit line pairs.

5. The semiconductor memory according to claim 1, further comprising means for detecting a change in said address information to generate a control signal for controlling said control circuit.

* * * * *